United States Patent [19]

Shafer

[11] 4,096,487
[45] Jun. 20, 1978

[54] RECORDING APPARATUS
[75] Inventor: Donald E. Shafer, Littleton, Colo.
[73] Assignee: Honeywell Inc., Minneapolis, Minn.
[21] Appl. No.: 743,481
[22] Filed: Nov. 19, 1976
[51] Int. Cl.² ............................................. G01D 15/24
[52] U.S. Cl. .................................. 346/110 R; 226/42; 346/136
[58] Field of Search ................... 346/110 R, 136, 161; 226/42; 360/75; 197/133 R; 358/132, 302; 318/326, 327; 340/263; 355/20

[56] References Cited
U.S. PATENT DOCUMENTS

| | | | |
|---|---|---|---|
| 3,146,432 | 8/1964 | Johnson | 340/263 |
| 3,341,853 | 9/1967 | Hadley | 346/110 R |
| 3,400,385 | 9/1968 | Jorgensen | 360/75 |
| 3,698,006 | 10/1972 | Ovshinsky | 358/300 X |
| 3,754,280 | 8/1973 | Lowe | 346/110 R |

Primary Examiner—Joseph W. Hartary
Attorney, Agent, or Firm—Laurence J. Marhoefer; Lockwood D. Burton

[57] ABSTRACT

Overlapping, and consequent illegibility, of recorded line scan or transverse records are precluded by delaying or inhibiting the recording process until the record sheet is being driven at or near full speed with respect to a normally blanked cathode ray tube record marking means. A voltage is established by a record speed select switch which must be substantially equaled by a voltage produced by a record sheet speed transducer before a comparator will turn on. The comparator output signal then allows the cathode ray tube to be unblanked and recording to start.

4 Claims, 2 Drawing Figures

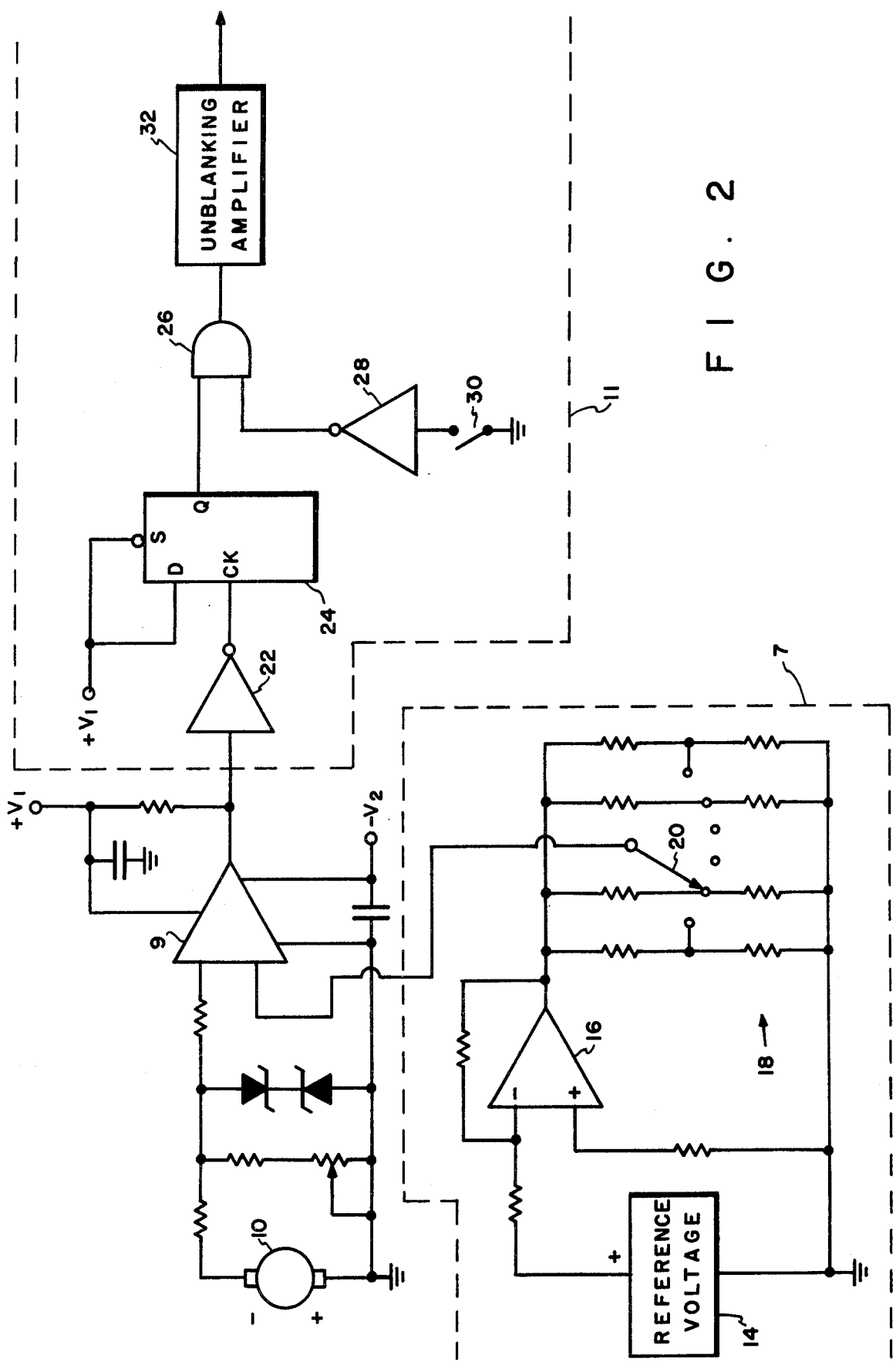
F I G. 2

RECORDING APPARATUS

BACKGROUND OF THE INVENTION

1. Field of the Invention

This invention relates to an improvement in apparatus for producing line scan and transverse graphic records of analog data, such as the variations with time of electrical data signals.

2. Description of the Prior Art

Graphic display apparatus for producing so-called line scan and transverse records are known in the prior art.

In transverse recording, the curves or traces representative of the variations with time of the analog data signals are produced across the width of the record sheet rather than along the length thereof, as in line scan recording. That is to say, transverse records proceed with time tranversely of the direction in which the record sheet is being moved relatively to the cathode ray tube.

As those skilled in the art understand, there are optimum speeds at which the record sheet must be moved with respect to the cathode ray tube, in both line scan and transverse recording, for the production of curves or traces having desirable aspect ratios. This optimum speed is different for data signals having different rates of variation, and hence, the line scan and transverse recording apparatus of the prior art usually is provided with an adjustable speed driving servo motor mechanism for moving the record sheet.

In the operation of such prior art line scan and transverse recording apparatus, it is the practice, in order to avoid unnecessary consumption of record sheet, to energize the cathode ray tube and its related circuits for a brief period before the driving servo motor mechanism for moving the record sheet with respect to the cathode ray tube is in motion. This is desirable in order to provide a warm-up period for the cathode ray tube and its related electronic circuitry. Also, in this period, the operator is provided an opportunity to check and to observe the performance of the circuitry and to make any necessary adjustments. When the servo motor mechanism is subsequently activated, there is a period during which the driving servo is accelerating in which the speed of movement of the record sheet relative to the cathode ray tube is less than the selected optimum value for the curves or traces to be recorded. In this period, there is a pronounced tendency for overlapping and illegibility of the curves or traces that are produced. If, after the record sheet has reached the selected optimum speed, the latter should become significantly less than the optimum value, there again will be a tendency for such overlapping and illegibility of the curves or traces.

SUMMARY OF THE INVENTION

Accordingly, it is an object of the present invention to provide improved graphic recording apparatus of the line scan and transverse recording types in which the above-mentioned overlapping and illegibility in the recorded curves or traces is avoided. In accomplishing this and other objects, the recording apparatus of the present invention utilizes means to delay or inhibit the recording operation of the cathode ray tube until the movement of the record sheet relative to the cathode ray tube is at or near the selected full speed for the data signals being recorded. Thus, there is provided a first voltage that is established in accordance with the adjustment of a record sheet speed select switch. This first voltage is compared by a comparator, to a second voltage that is produced by a transducer which is responsive to the speed at which the recording sheet is being moved relative to the cathode ray tube. The arrangement is such that the said second voltage must be substantially equal to the said first voltage before the comparator will turn on. The comparator output signal will then allow the cathode ray tube to be unblanked and recording to start or, if recording already is underway, to continue.

BRIEF DESCRIPTION OF THE DRAWINGS

A better understanding of the present invention may be had from the following detailed description when read in connection with the accompanying drawings wherein:

FIG. 2 is a schematic circuit diagram of the novel record delaying or inhibiting circuitry of the present invention.

DESCRIPTION OF THE PREFERRED EMBODIMENTS

The Apparatus of FIG. 1

Figure 1:
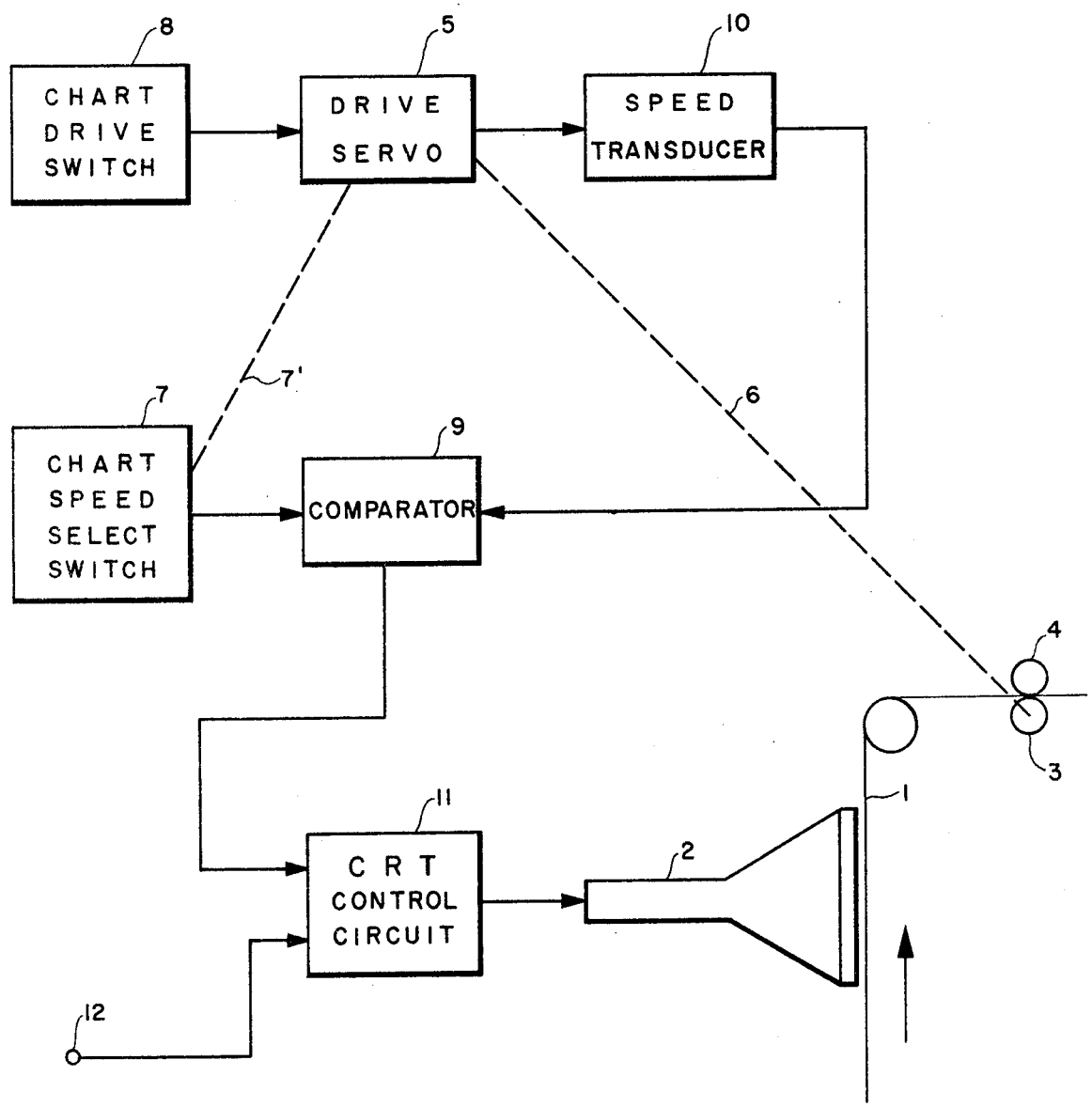
FIG. 1 is a schematic diagram showing in block form the major components of the apparatus for delaying or inhibiting the marking or record making operation of the recording fiber optics cathode ray tube until the movement of the record sheet is at or near the selected full speed.

The block diagram of FIG. 1 shows the major components of the recording apparatus according to the present invention for delaying or inhibiting the operation of the cathode ray tube until the movement of a photosensitive record sheet or rectangular chart 1 relative to the face of a fiber optics cathode ray tube 2 is at or near the selected and desired full speed. The record sheet 1 is drawn upwardly from a suitable supply (not shown) of photosensitive record sheet closely adjacent the face of the cathode ray tube 2. This movement is effected by the rotation of a drive roll 3 and a cooperating pinch roll 4. Desirably, the pinch roll 4 is suitably biased downwardly by means not shown to press the record sheet 1 firmly into engagement with the drive roll 3. The drive roll 3 is driven in a clockwise direction, as seen in FIG. 1, by a drive servo motor mechanism 5 through a suitable mechanical link indicated by a dotted line 6. The servo motor mechanism 5 desirably is of a type that provides several adjustable and selectable speeds of rotation of its output shaft, being provided with suitable mechanically adjustable gearing or adjustable electrical circuitry for the purpose.

A record sheet or chart speed select switch 7, having a connection or line 7' to the servo motor 5, is provided to adjust the latter for pre-selecting the desired speed of movement of the record sheet 1 past the face of the cathode ray tube 2. This link 7', as those skilled in the art will understand, may be either mechanical or electrical to the end that the output shaft of the servo motor 5 is in accordance with the adjusted position of switch 7. Also, as shown, a record sheet or chart drive switch 8 is provided to start and to stop the movement of the record sheet, as desired.

In addition to enabling pre-selection of the record sheet or chart speed by the servo motor 5, the chart speed select switch 7 provides a first direct current voltage having a magnitude that is in accordance with the chart speed that has been selected. That voltage is applied to a first input of a voltage comparator 9. A second voltage input of the comparator 9 is connected to the output of a speed transducer 10, for example, a DC tachometer. The speed transducer 10 is mechanically connected to the output shaft of the servo motor 5 and produces a second direct current voltage in accordance with the speed of rotation of that shaft. The comparator 9 is turned on when the first and second voltages are substantially equal.

The output of the voltage comparator 9 is connected to a first input of and controls a cathode ray tube control circuit 11. The circuit 11 is arranged to normally provide a blanking signal to the cathode ray tube 2 whereby the latter is inoperative to produce a mark or record on the chart 1. When turned on, the comparator 9 provides a signal, in cooperation with the data to be recorded, for unblanking the cathode ray tube to allow the latter to be unblanked and recording to start.

Data to be recorded by the cathode ray tube upon the record sheet 1 is applied to a second input of the cathode ray tube control circuit 11 from a source of data signals 12. When data signals are in the form of high frequency information, the cathode ray tube desirably may be provided with appropriate vertical and horizontal deflection means (not shown) for deflecting the electron beam of the tube 2. The vertical deflection means of the tube 2 typically would then be energized in accordance with the high frequency information from the source 12. With such an arrangement, the horizontal deflection means typically would be energized to cause the electron beam repetitively to sweep horizontally across the face of the cathode ray tube, whereby transverse recording would be effected. That is to say, the curves or traces produced on the chart 1 would proceed across the width of the chart substantially at a right angle to the direction in which the record sheet is moved relative to the cathode ray tube 2. In order to compensate for skew that would tend to be produced because of the motion of the chart 1, suitable skew correction means normally would be provided, as those skilled in the art understand. Such skew correction means and the necessary circuitry required to produce the described deflections of the electron beam of the cathode ray tube 2 form no part of the present invention and are not shown in order to avoid undue complication of the drawing and of the description.

THE OPERATION OF THE FIG. 1 APPARATUS

In the operation of the FIG. 1 apparatus, the voltage established by the chart speed select switch 7 must be equaled by the voltage produced by the chart speed transducer 10 before the comparator 9 will turn on. In its off state, the comparator 9 is effective to control the cathode ray tube intensity circuit 11 to keep the cathode ray tube 2 blanked irrespective of any data information signals that may be applied to the circuit 11 from the source 12.

When substantial equality is established between the voltage produced by the chart speed select switch 7 and the speed transducer 10, the comparator 9 turns on to produce a signal that controls the cathode ray tube control circuit 11. This unblanks the cathode ray tube 2 and allows recording to start. Whether curves and traces or other records are produced on the chart 1, however, depends upon the signals that are applied to the circuit 11 from the data source 12.

THE APPARATUS OF FIG. 2

In the circuit of FIG. 2, the circuit elements which correspond to similar elements in FIG. 1 bear reference numerals which are identical to those of FIG. 1. The chart speed select switch circuit 7 includes a reference voltage source 14, the positive terminal of which is connected to the inverting input of an operational amplifier 16. The noninverting input of the operational amplifier 16 is connected to ground. The output of the operational amplifier is connected to a bank of voltage dividers 18 each with a different division ratio. A switch 20 has a movable contact arranged to engage a selected one of the voltage divider elements. This switch, in practice, is ganged with the chart speed select switch hereinbefore referred to with the differing voltage dividers producing a signal which corresponds with the select speed for the recording medium. The movable contact of the switch 20 is connected to one input terminal of the voltage comparator 9. The DC tachometer 10 corresponds to the speed transducer 10 illustrated in FIG. 1. The DC tachometer has a negative terminal thereof connected through a resistance network to the other terminal of the comparator 9. As was previously noted, the comparator 9 is arranged to be in a "off" condition whenever the signal from the tachometer generator 10 is significantly less than the signal produced at the movable contact of the switch 20. The output of the comparator 9 is connected through an inverter 22 to the clock input of a D-type flip-flop 24. The Q output of the flip-flop 24 is connected to one input of an AND gate 26. The other input terminal of the AND gate 26 is connected through an inverter 28 and a selectively operated switch 30 to ground. The output of the AND gate 26 is connected to the input of an unblanking amplifier 32, the output of which is connected to control the operation of the CRT 2 as shown in FIG. 1.

OPERATION OF THE CIRCUIT OF FIG. 2

The tachometer generator 10 produces an output signal which is a function of the actual speed at which the record member is being driven. In the speed selection switch arrangement 7, the reference voltage source 14 applies a suitable reference voltage to the inverting input of the operational amplifier 16, the non-inverting input of which is connected to ground. The operational amplifier 16 inverts the signal to produce a controlled negative signal at the output thereof. The several voltage dividers of the voltage divider network 18 are arranged to provide a signal at the movable arm of the switch 20 which is representative of a signal that should be matched by the tachometer generator at any of the selected speeds. Thus, for any selected speed of chart drive, a particular reference signal will be applied to the reference terminal of the comparator 9. A signal representative of the actual speed of the chart drive is applied to the other terminal of the comparator from the tachometer generator 10. When, for any reason, the signal from the tachometer generator 10, representing the actual speed of chart drive, is significantly less than the reference signal from the chart speed selecting switch assembly 7; the output of the comparator 9 is in the "off" condition. In order for the recording CRT to be operative, there must be a logical "1" at the input of the unblanking amplifier 32. The logical "1" at the input of the unblanking amplifier 32 is produced from the output of the AND gate 26 whenever both inputs to the AND gate 26 are logical "1's". A first logical "1" is applied to the input of the AND gate 26 by the closure of the switch 30 and the inverter 28. The other logical "1" is applied to the other input of the AND gate 26 when a logical "1" appears at the Q output of the flip-flop 24. Such a logical "1" appears at the Q output of the flip-flop 24 when the output of the comparator 9 operating through the inverter 22 is in an "on" condition. On the other hand, when the relationship of the signal that the input of the comparator 9 or such that the output of the comparator 9 is in an "off" condition, a logical "0" will appear at the Q output of the flip-flop 24 causing the recording CRT to be blanked. The switch 30 comprises a selection switch whereby the delayed operation of the recording apparatus may be disabled.

Thus, there has been provided in accordance with the present invention an improved apparatus for avoiding overlapping and illegibility of recorded data on transverse records. This is achieved by delaying the recording process until the movement of the record sheet or chart is at or near the selected full speed. A voltage is established by the chart speed select switch, which voltage must be substantially equaled by a voltage developed by the chart speed transducer before the comparator will turn on. The comparator output signal then allows the cathode ray tube to be unblanked in response to data signals to be recorded and recording to start. Should the speed of movement of the record sheet drop off significantly during operation, recording will be prevented until restoration of the movement of said record sheet to or near full speed is made.

The embodiments of the invention in which an exclusive property or privilege is claimed are defined as follows:

1. Recording apparatus having a light sensitive record receiving member, marking means including a cathode ray tube, and motive means to move said record receiving member relatively to said marking means, means to produce a first signal the magnitude of which is indicative of a desired rate of movement of said record receiving member relatively to said marking means, means to produce a second signal the magnitude of which is indicative of the actual rate of said relative movement, and comparator means jointly responsive to said signals and operative upon start-up of said motive means to inhibit the operation of said marking means until a characteristic of said second signal bears a predetermined relationship to a characteristic of said first signal.

2. Recording apparatus as specified in claim 1 wherein said predetermined relationship comprises a condition of substantial equality of said characteristics of said signals.

3. In a recording system for recording data signals on a record receiving member having a cathode ray tube for producing a light image on the face thereof in accordance with the data signals, a light sensitive record receiving member, and means for driving said record receiving member at a predetermined speed across said face of said tube to record said light image thereon, the improvement comprising:
    means for deriving first signal indicative of said predetermined speed of movement of said record receiving member,
    means for deriving a second signal indicative of the actual speed of movement of said record receiving member relative to said face of said cathode ray tube,
    means for comparing said first and second derived signals, and
    means responsive to said comparing means to inhibit the production of said light image whenever said second derived signal is significantly less than said first derived signal.

4. A recording apparatus including a cathode ray tube recording means, a photosensitive record receiving member operatively associated relative to a face of said cathode ray tube,
    driving means for driving said record receiving member at a selected speed relative to said face of said cathode ray tube,
    speed selection means for selecting any of a number of predetermined speeds at which said record receiving member is to be driven,
    said speed selection means including a speed select switch means connected to said driving means to preselect the speed thereof,
    adjustable reference voltage level means, said speed select switch means being also connected to said reference voltage level means for adjusting the reference voltage level to produce a voltage signal level representative of the selected speed,
    speed sensitive signal producing means operatively coupled to said driving means to produce a voltage level signal representative of the actual speed of said driving means,
    a voltage signal comparator connected to compare said reference voltage level signal with signal representative of the actual speed,
    and means responsive to the output of said comparator to blank the operation of said cathode ray tube whenever said actual speed is less than said selected speed.

* * * * *